(12) United States Patent
Hou et al.

(10) Patent No.: US 10,872,677 B2
(45) Date of Patent: Dec. 22, 2020

(54) SHIFT REGISTER UNIT, GATE DRIVE CIRCUIT AND DRIVING METHOD THEREOF

(71) Applicants: Hefei BOE Optoelectronics Technology Co., Ltd., Hefei (CN); BOE TECHNOLOGY GROUP CO., LTD., Beijing (CN)

(72) Inventors: Yongkang Hou, Beijing (CN); Zhen Zhang, Beijing (CN)

(73) Assignees: Hefei BOE Optoelectronics Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/574,494

(22) Filed: Sep. 18, 2019

(65) Prior Publication Data
US 2020/0227127 A1 Jul. 16, 2020

(30) Foreign Application Priority Data
Jan. 10, 2019 (CN) .......................... 2019 1 0024519

(51) Int. Cl.
*G11C 19/28* (2006.01)
*G09G 3/3266* (2016.01)
*G09G 3/36* (2006.01)

(52) U.S. Cl.
CPC ........... *G11C 19/28* (2013.01); *G09G 3/3266* (2013.01); *G09G 3/3677* (2013.01); *G09G 2300/0408* (2013.01); *G09G 2310/0286* (2013.01)

(58) Field of Classification Search
CPC .... G11C 19/28; G09G 3/3266; G09G 3/3677; G09G 2300/0408; G09G 2310/0286
See application file for complete search history.

(56) References Cited

U.S. PATENT DOCUMENTS

2017/0221441 A1* 8/2017 Gu ........................ G06F 3/044

* cited by examiner

*Primary Examiner* — Wing H Chow
(74) *Attorney, Agent, or Firm* — Thomas | Horstemeyer LLP

(57) ABSTRACT

The present disclosure discloses a shift register unit, a gate drive circuit, and a driving method thereof, and relates to the field of display technologies. The shift register unit includes an input sub-circuit, an output control sub-circuit, and an output sub-circuit. The input sub-circuit is coupled to a first node and a first voltage terminal, and is configured to output a first voltage signal to the first node in response to an input control signal. The output control sub-circuit is coupled to the first node, a second node, and a clock signal terminal, and is configured to output an output control signal to the second node in response to the first voltage signal and a clock signal. The output sub-circuit is coupled to the second node, a DC voltage terminal, and an output terminal, and is configured to output a DC voltage signal to the output terminal under the control of the output control signal.

15 Claims, 6 Drawing Sheets

SHIFT REGISTER UNIT, GATE DRIVE CIRCUIT AND DRIVING METHOD THEREOF

CROSS-REFERENCE TO RELATED APPLICATION

This application is based upon and claims priority to Chinese Patent Application No. 201910024519.6, filed on Jan. 10, 2019, where the entire contents thereof are incorporated herein by reference.

TECHNICAL FIELD

The present disclosure relates to the field of display technologies and, more particularly, to a shift register unit, a gate drive circuit, and a driving method thereof.

BACKGROUND

With the development of display technologies, display panels having a high-resolution and narrow-frame have become popular in the field of displays; therefore, GOA (Gate Driver on Array) circuits have been emerging. A gate drive circuit refers specifically to a circuit formed by directly integrating a gate drive circuit of the display panel in a non-display area of an array substrate which can replace a driver chip externally coupled to the array substrate, and has the advantages of low cost, a small number of processes, and high yield.

However, an output terminal of each of the shift register units in the gate drive circuit is generally directly coupled to a clock signal terminal through a drive transistor. Since a clock signal is an AC signal, in order to ensure that the shift register unit has a good driving and outputting speed, the driver transistor usually has a significantly large size. As such, there is a large parasitic capacitance between a control electrode and another electrode of the driver transistor, which easily leads to a large dynamic power consumption of the shift register unit and a serious clock feedthrough effect, and tends to affect the output stability of the gate drive circuit where each of the shift register units is located.

SUMMARY

Embodiments of the present disclosure provide a shift register unit, a gate drive circuit, and a driving method thereof.

A first aspect of the embodiments of the present disclosure provides a shift register unit including an input sub-circuit, an output control sub-circuit, and an output sub-circuit. The input sub-circuit is coupled to a first node and a first voltage terminal, and is configured to output a first voltage signal supplied by the first voltage terminal to the first node in response to an input control signal. The output control sub-circuit is coupled to the first node, a second node, and a clock signal terminal, and is configured to output an output control signal to the second node in response to the first voltage signal and a clock signal supplied by the clock signal terminal. The output sub-circuit is coupled to the second node, a DC voltage terminal, and an output terminal, and is configured to output a DC voltage signal supplied by the DC voltage terminal to the output terminal under the control of the output control signal.

In an embodiment of the present disclosure, the input sub-circuit includes a first transistor. The first transistor has a control electrode coupled to a display input terminal to receive the input control signal, a first electrode coupled to the first voltage terminal, and a second electrode coupled to the first node.

In an embodiment of the present disclosure, the output control sub-circuit includes a second transistor and a third transistor. The second transistor has a control electrode coupled to the first node, a first electrode coupled to the clock signal terminal, and a second electrode coupled to a control electrode of the third transistor. The third transistor further has a first electrode coupled to the first node and a second electrode coupled to the second node.

In an embodiment of the present disclosure, the output sub-circuit includes a fourth transistor. The fourth transistor has a control electrode coupled to the second node to receive the output control signal, a first electrode coupled to the DC voltage terminal, and a second electrode coupled to the output terminal.

In an embodiment of the present disclosure, the shift register unit further includes a noise reduction sub-circuit which includes a first noise reduction sub-circuit. The first noise reduction sub-circuit is coupled to the second voltage terminal and the output control sub-circuit, and is configured to perform noise reduction on the output control sub-circuit in response to the second voltage signal supplied by the second voltage terminal.

In an embodiment of the present disclosure, the first noise reduction sub-circuit includes a fifth transistor. The fifth transistor has a control electrode coupled to the second voltage terminal, a first electrode coupled to a common voltage terminal to receive a common voltage signal, and a second electrode coupled to the output control sub-circuit.

In an embodiment of the present disclosure, the noise reduction sub-circuit further includes a second noise reduction sub-circuit, which includes a noise reduction control sub-circuit, a second node noise reduction sub-circuit, and an output terminal noise reduction sub-circuit. The noise reduction control sub-circuit is coupled to a third voltage terminal, the first node, the second node noise reduction sub-circuit, and the output terminal noise reduction sub-circuit, and is configured to output a noise reduction control signal to the second node noise reduction sub-circuit and the output terminal noise reduction sub-circuit under the control of a voltage signal at the first node and a third voltage signal supplied by the third voltage terminal. The second node noise reduction sub-circuit is coupled to the second node and is configured to perform noise reduction on the second node under the control of the noise reduction control signal. The output terminal noise reduction sub-circuit is coupled to the output terminal and is configured to perform noise reduction on the output terminal under the control of the noise reduction control signal.

In an embodiment of the present disclosure, the noise reduction control sub-circuit includes a sixth transistor, a seventh transistor, an eighth transistor, a ninth transistor, and a third node. The sixth transistor has a control electrode and a first electrode coupled to the third voltage terminal, respectively, and a second electrode coupled to a control electrode of the seventh transistor. The seventh transistor further has a first electrode coupled to the third voltage terminal and a second electrode coupled to the third node. A control electrode of the eighth transistor and a control electrode of the ninth transistor are coupled to the first node, respectively, and the eighth transistor further has a first electrode coupled to the common voltage terminal to receive a common voltage signal and a second electrode coupled to the third node. The ninth transistor further has a first electrode coupled to the common voltage terminal to receive the common voltage signal and a second electrode coupled to the control electrode of the seventh transistor.

In an embodiment of the present disclosure, the second node noise reduction sub-circuit includes a tenth transistor. The tenth transistor has a control electrode coupled to the third node to receive the noise reduction control signal, a first electrode coupled to the common voltage terminal to receive the common voltage signal, and a second electrode coupled to the second node.

In an embodiment of the present disclosure, the output terminal noise reduction sub-circuit includes an eleventh transistor. The eleventh transistor has a control electrode coupled to the third node to receive the noise reduction control signal, a first electrode coupled to the common voltage terminal to receive the common voltage signal, and a second electrode coupled to the output terminal.

In an embodiment of the present disclosure, the shift register unit further includes a storage sub-circuit. The storage sub-circuit is coupled to the first node and the output terminal, and is configured to store the first voltage signal received by the first node.

In an embodiment of the present disclosure, the shift register unit further includes a reset sub-circuit. The reset sub-circuit is coupled to a reset signal terminal, the first node, and the second node, and is configured to reset the first node and the second node in response to a reset signal provided by the reset signal terminal.

In an embodiment of the present disclosure, the reset sub-circuit includes a twelfth transistor and a thirteenth transistor. Control electrodes of the twelfth and thirteenth transistors are coupled to the reset signal terminal, respectively. The twelfth transistor further has a first electrode coupled to the common voltage terminal to receive a common voltage signal and a second electrode coupled to the first node. The thirteenth transistor further includes a first electrode coupled to the common voltage terminal to receive the common voltage signal, and a second electrode coupled to the second node.

Based on the above technical solutions of the shift register unit, a second aspect of an embodiment of the present disclosure provides a gate drive circuit including a plurality of cascaded shift register units as described in the above technical solutions.

Based on the technical solutions of the gate drive circuit, a third aspect of the embodiments of the present disclosure provides a driving method for a gate drive circuit including:

at an input phase, outputting, by the input sub-circuit, the first voltage signal supplied by the first voltage terminal to the first node in response to the input control signal; and at an output phase, outputting, by the output control sub-circuit, the output control signal to the second node in response to the first voltage signal and the clock signal supplied by the clock signal terminal, and outputting the DC voltage signal supplied by the DC voltage terminal to the output terminal under the control of the output control signal.

In an embodiment of the present disclosure, when each of the shift register units of the gate drive circuit includes the first noise reduction sub-circuit, the driving method for the gate drive circuit further includes, before the input phase: at a noise reduction phase, performing, by the first noise reduction sub-circuit, noise reduction on the output control sub-circuit in response to a second voltage signal supplied by the second voltage terminal.

In an embodiment of the present disclosure, when each of the shift register units of the gate drive circuit includes the second noise reduction sub-circuit, the step at the noise reduction phase further includes: outputting, by the noise reduction control sub-circuit, a noise reduction control signal to the second node noise reduction sub-circuit and the output terminal noise reduction sub-circuit under the control of a voltage signal of the first node and a third voltage signal supplied by the third voltage terminal; and performing, by the second node noise reduction sub-circuit, noise reduction on the second node and performing, by the output terminal noise reduction sub-circuit, noise reduction on the output terminal, under the control of the noise reduction control signal.

In an embodiment of the present disclosure, when each of the shift register units of the gate drive circuit includes a reset sub-circuit, the driving method further comprises, after the output phase: at a reset phase, resetting, by the reset sub-circuit, the first node and the second node in response to a reset signal supplied by the reset signal terminal.

BRIEF DESCRIPTION OF THE DRAWINGS

The accompanying drawings illustrated herein provide further understanding of the present disclosure and constitute a part of this application. Exemplary embodiments of the present disclosure and the description thereof serve to explain the present disclosure and are not intended to limit the present disclosure. In the drawings.

DETAILED DESCRIPTION

For ease of understanding, the shift register unit, the gate drive circuit and the driving method thereof provided by the embodiments of the present disclosure will be described in detail below with reference to the accompanying drawings.

Figure 1:
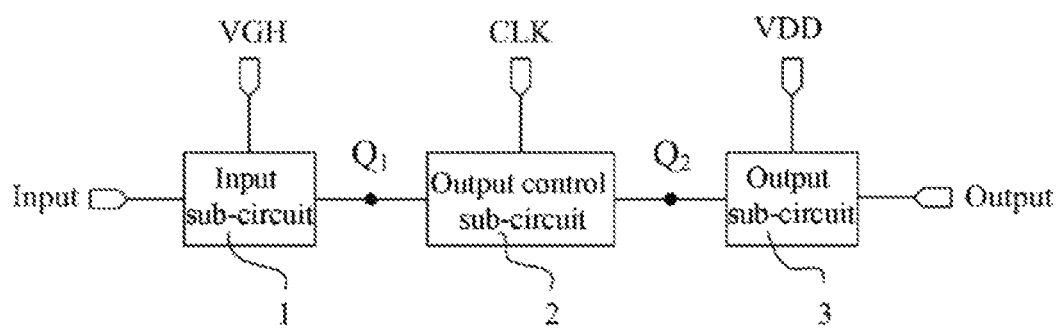
FIG. 1 is a schematic structural diagram illustrating a shift register unit according to an embodiment of the present disclosure.

Referring to FIG. 1, an embodiment of the present disclosure provides a shift register unit which includes an input sub-circuit 1, an output control sub-circuit 2, and an output sub-circuit 3. The input sub-circuit 1 is coupled to a first node $Q_1$ and a first voltage terminal VGH, and is configured to output a first voltage signal supplied from the first voltage terminal VGH to the first node $Q_1$ in response to an input control signal. The output control sub-circuit 2 is coupled to the first node $Q_1$, a second node $Q_2$, and a clock signal terminal CLK, and is configured to output an output control signal to the second node $Q_2$ in response to the first voltage signal and a clock signal supplied from the clock signal terminal CLK. The output sub-circuit 3 is coupled to the second node $Q_2$, a DC voltage terminal VDD, and an output terminal Output, and is configured to output a DC voltage signal supplied from the DC voltage terminal VDD to the output terminal Output under the control of the output control signal.

In the shift register unit provided by the embodiment of the present disclosure, the output control sub-circuit 2 is disposed between the input sub-circuit 1 and the output sub-circuit 3, and the output sub-circuit 3 is coupled to the DC voltage terminal VDD and the output terminal Output, respectively. Thus, the output control sub-circuit 2 may be used as a control switch of the output sub-circuit 3, where the turning on and off of which can be determined by the first voltage signal and the clock signal. When the control switch is turned on, the output sub-circuit 3 outputs the DC voltage signal provided by the DC voltage terminal VDD to the output terminal Output based on the output control signal so as to avoid a clock feedthrough effect caused by the direct connection between the output sub-circuit 3 and the clock signal terminal CLK and the direct output of the clock signal and, at the same time, ensuring that the output sub-circuit 3 does not have a false output due to a feedthrough voltage, which is advantageous for improving the output stability of the output sub-circuit 3 in the shift register unit, and further improving the output stability of a gate drive circuit where the shift register unit is located.

Figure 2:
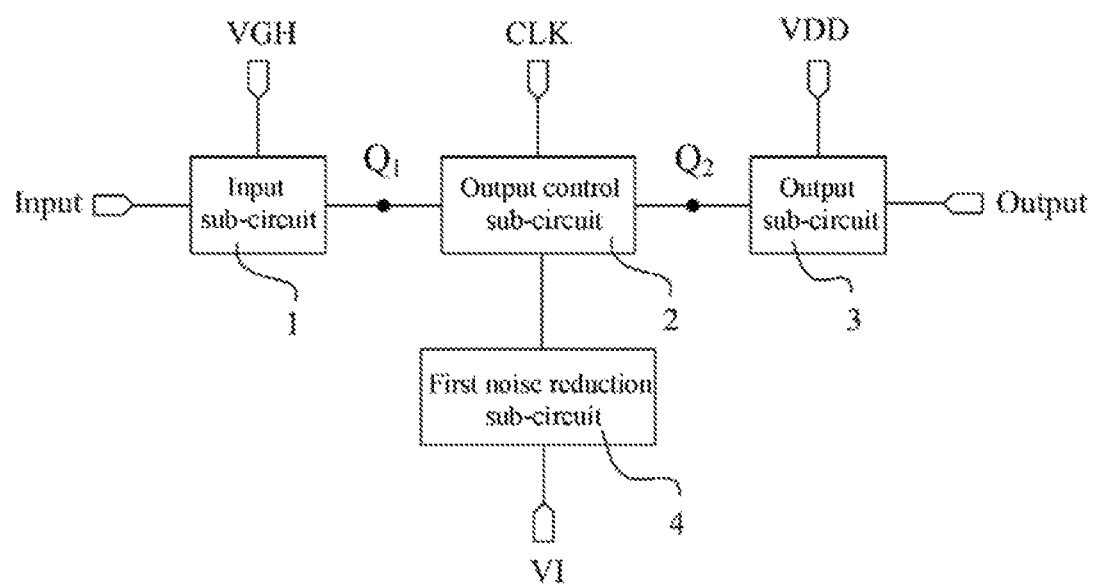
FIG. 2 is a schematic structural diagram illustrating another shift register unit according to an embodiment of the present disclosure.

For the effective noise reduction of the output control sub-circuit 2, in some embodiments of the present disclosure, referring to FIG. 2, the shift register unit further includes a noise reduction sub-circuit, which includes a first noise reduction sub-circuit 4. The first noise reduction sub-circuit 4 is coupled to a second voltage terminal VI and the output control sub-circuit 2, and is configured to perform noise reduction on the output control sub-circuit 2 in response to a second voltage signal provided by the second voltage terminal VI. In the shift register unit provided by the embodiment of the present disclosure, the first noise reduction sub-circuit 4 is coupled to the output control sub-circuit 2, and is provided to perform noise reduction processing of the output control sub-circuit 2 before any input from the input sub-circuit 1, which prevents the output control sub-circuit 2 from having false output due to residual charge so as to further improve the output stability of the shift register unit.

Figure 3:
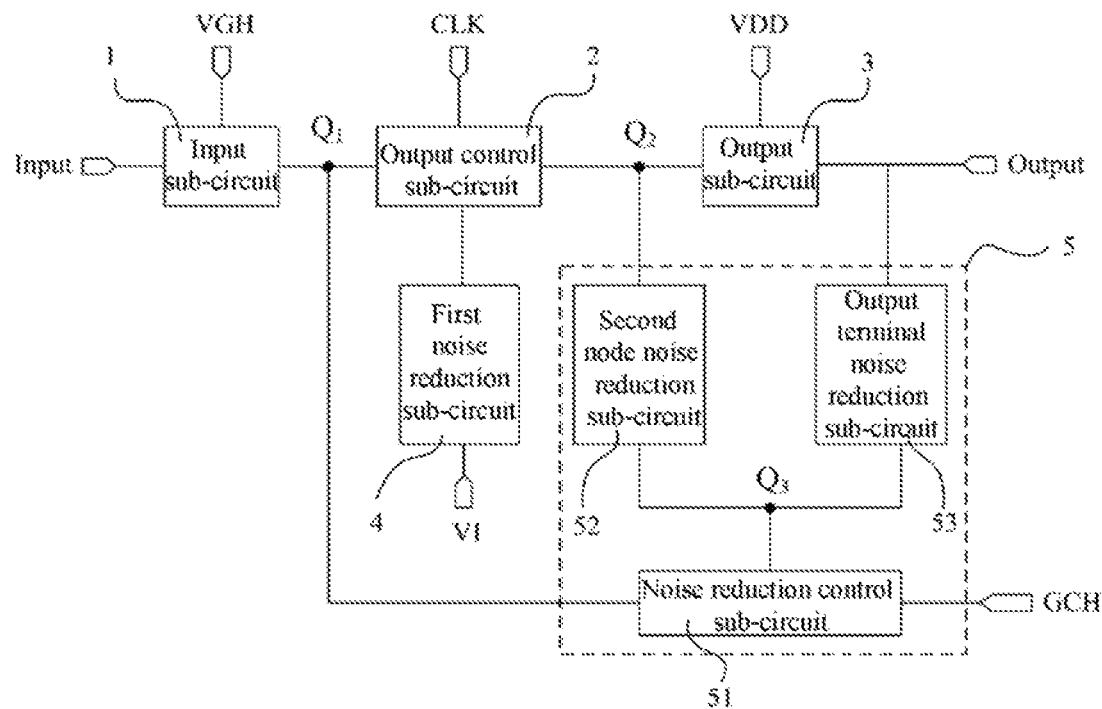
FIG. 3 is a schematic structural diagram illustrating another shift register unit according to an embodiment of the present disclosure.

It shall be noted that the shift register unit provided by an embodiment of the present disclosure may also perform noise reduction on the second node $Q_2$ and the output terminal Output, respectively, in addition to the output control sub-circuit 2. By way of example, referring to FIG. 3, the above-described noise reduction sub-circuit further includes a second noise reduction sub-circuit 5, which includes a noise reduction control sub-circuit 51, a second node noise reduction sub-circuit 52, and an output terminal noise reduction sub-circuit 53. The noise reduction control sub-circuit 51 is coupled to a third voltage terminal GCH, the first node $Q_1$, the second node noise reduction sub-circuit 52, and the output terminal noise reduction sub-circuit 53, and is configured to output a noise reduction control signal to the second node noise reduction sub-circuit 52 and the output terminal noise reduction sub-circuit 53 under the control of a voltage signal at the first node $Q_1$ and a third voltage signal supplied from the third voltage terminal GCH. The second node noise reduction sub-circuit 52 is coupled to the second node $Q_2$, and is configured to perform noise reduction on the second node $Q_2$ under the control of the noise reduction control signal. The output terminal noise reduction sub-circuit 53 is coupled to the output terminal Output and configured to perform noise reduction on the output terminal Output under the control of the noise reduction control signal.

In the shift register unit provided by the embodiment of the present disclosure, the second noise reduction sub-circuit 5, which is coupled to the second node $Q_2$ and the output terminal Output, respectively, is provided to perform noise reduction processing on the second node $Q_2$ and the output terminal Output before any input from the input sub-circuit 1, thereby preventing the output sub-circuit 3 from having any false output due to residual charges, so as to further improve the output stability of the shift register unit.

Figure 4:
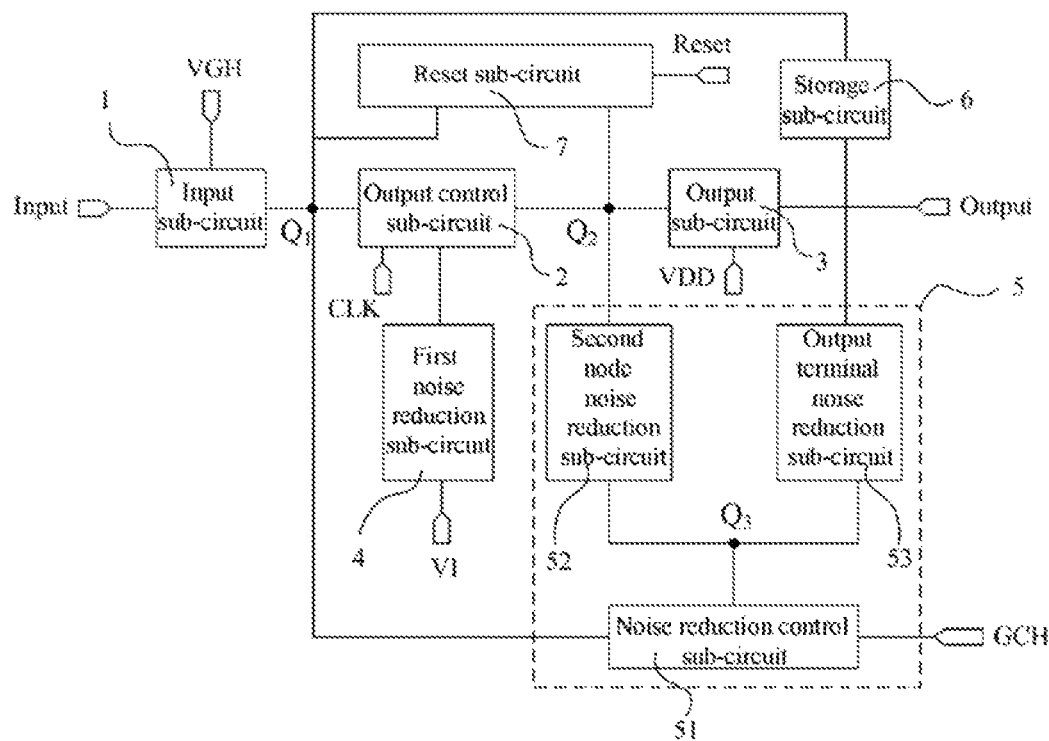
FIG. 4 is a schematic structural diagram illustrating another shift register unit according to an embodiment of the present disclosure.

It may be appreciated that, in some embodiments when the input sub-circuit 1 outputs the first voltage signal to the first node $Q_1$, in order to ensure that the first voltage signal is kept at the first node $Q_1$, referring to FIG. 4, the shift register unit is further provided with a storage sub-circuit 6. The storage sub-circuit 6 is coupled to the first node $Q_1$ and the output terminal Output and is configured to store the first voltage signal received by the first node $Q_1$. In the shift register unit provided by the embodiment of the present disclosure, when the input sub-circuit 1 outputs the first voltage signal, the storage sub-circuit 6 may be used to store the first voltage signal and maintain it at the first node $Q_1$ to control the maintaining of the voltage signal at the first node $Q_1$.

It is worth mentioning that the above shift register units may be cascaded to form a gate drive circuit, and it needs to be reset in time after each output driving in order to prepare for next output driving. Based on this, in some embodiments, referring to FIG. 4, the shift register unit further includes a reset sub-circuit 7. The reset sub-circuit 7 is coupled to a reset signal terminal Reset, the first node $Q_1$, and the second node $Q_2$, and is configured to reset the first node $Q_1$ and the second node $Q_2$ in response to a reset signal provided by the reset signal terminal Reset. In the shift register unit provided by the embodiment of the present disclosure, the reset sub-circuit 7 may be used to reset the first node $Q_1$ and the second node $Q_2$ under the control of the reset signal, that is, reset the output from the input sub-circuit 1 and the input to the output sub-circuit 3 to ensure that the shift register unit is ready for the next output driving.

Figure 5:
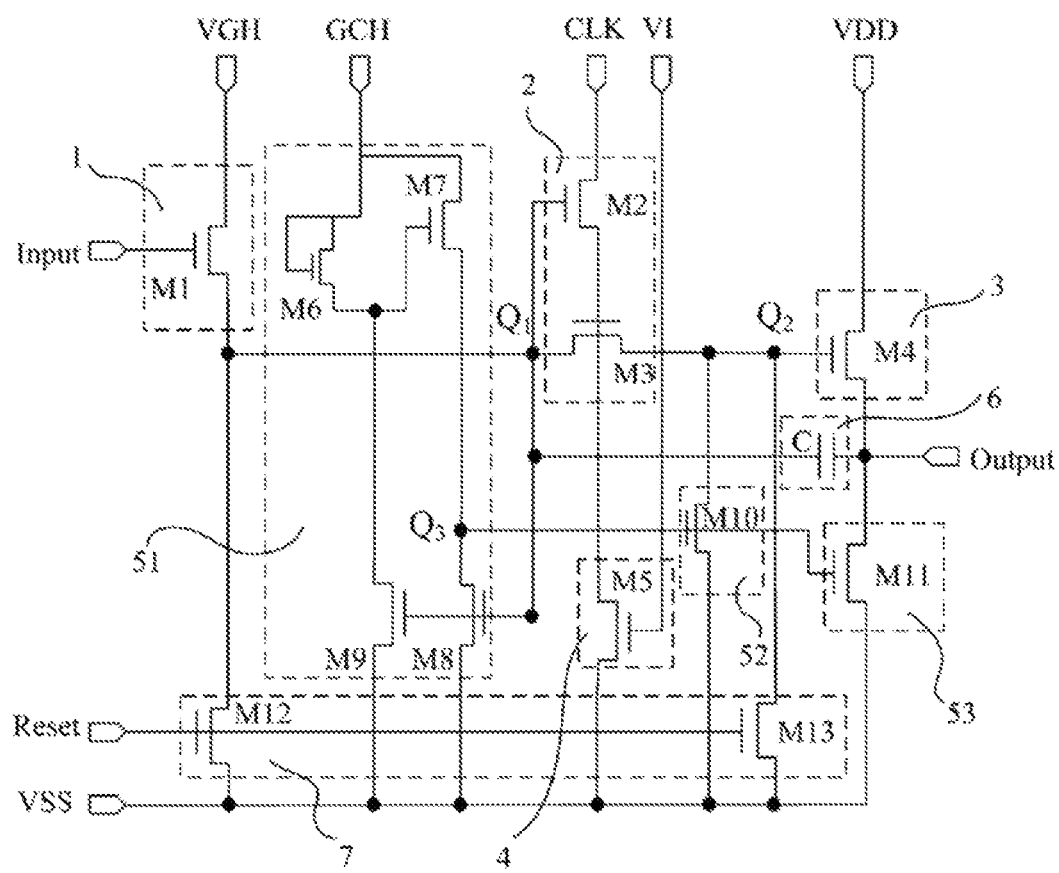
FIG. 5 is a schematic structural diagram illustrating another shift register unit according to an embodiment of the present disclosure.

In order to more clearly explain the shift register unit provided by the above embodiment, the present embodiment provides a shift register unit as shown in FIG. 5, which is described as follows.

The above shift register units may be cascaded to form a gate drive circuit, and an input control signal received by its input sub-circuit 1 is derived from a display control signal. In an embodiment, referring to FIG. 5, the above input sub-circuit 1 includes a first transistor M1, which has a control electrode coupled to a display input terminal Input to receive an input control signal, a first electrode coupled to a first voltage terminal VGH, and a second electrode coupled to the first node $Q_1$. The above-described storage sub-circuit 6 includes a storage capacitor C, which has a first electrode coupled to the first node $Q_1$ and a second electrode coupled to the output terminal Output. When the first transistor M1 is turned on under the control of the input control signal supplied by the display input terminal Input, the first transistor M1 outputs the first voltage signal provided by the first voltage terminal VGH to the first node $Q_1$. The storage capacitor C is charged and stores the first voltage signal to maintain the first voltage signal as a voltage signal of the first node $Q_1$.

Figure 6:
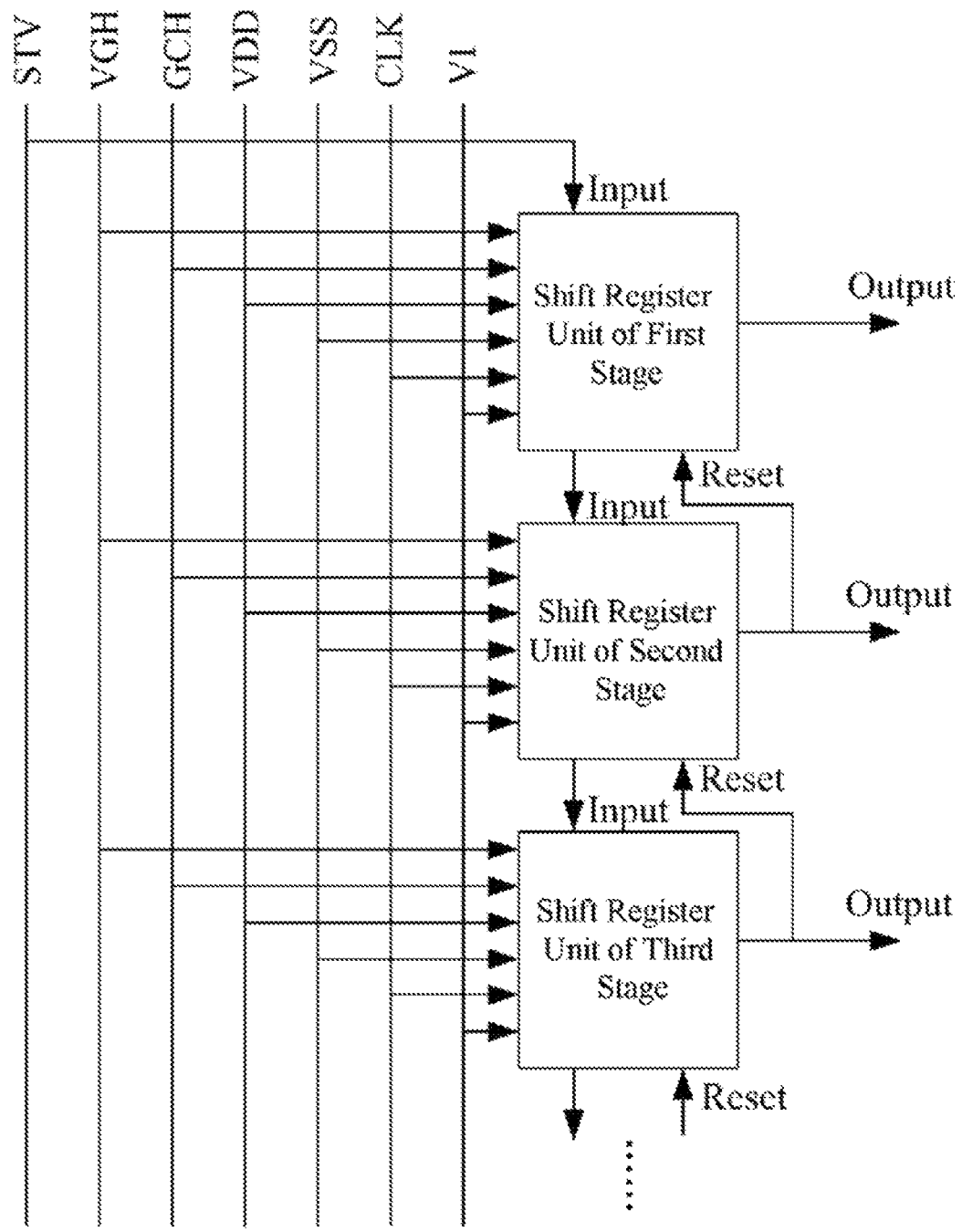
FIG. 6 is a schematic structural diagram illustrating a gate drive circuit according to an embodiment of the present disclosure.
Figure 7:
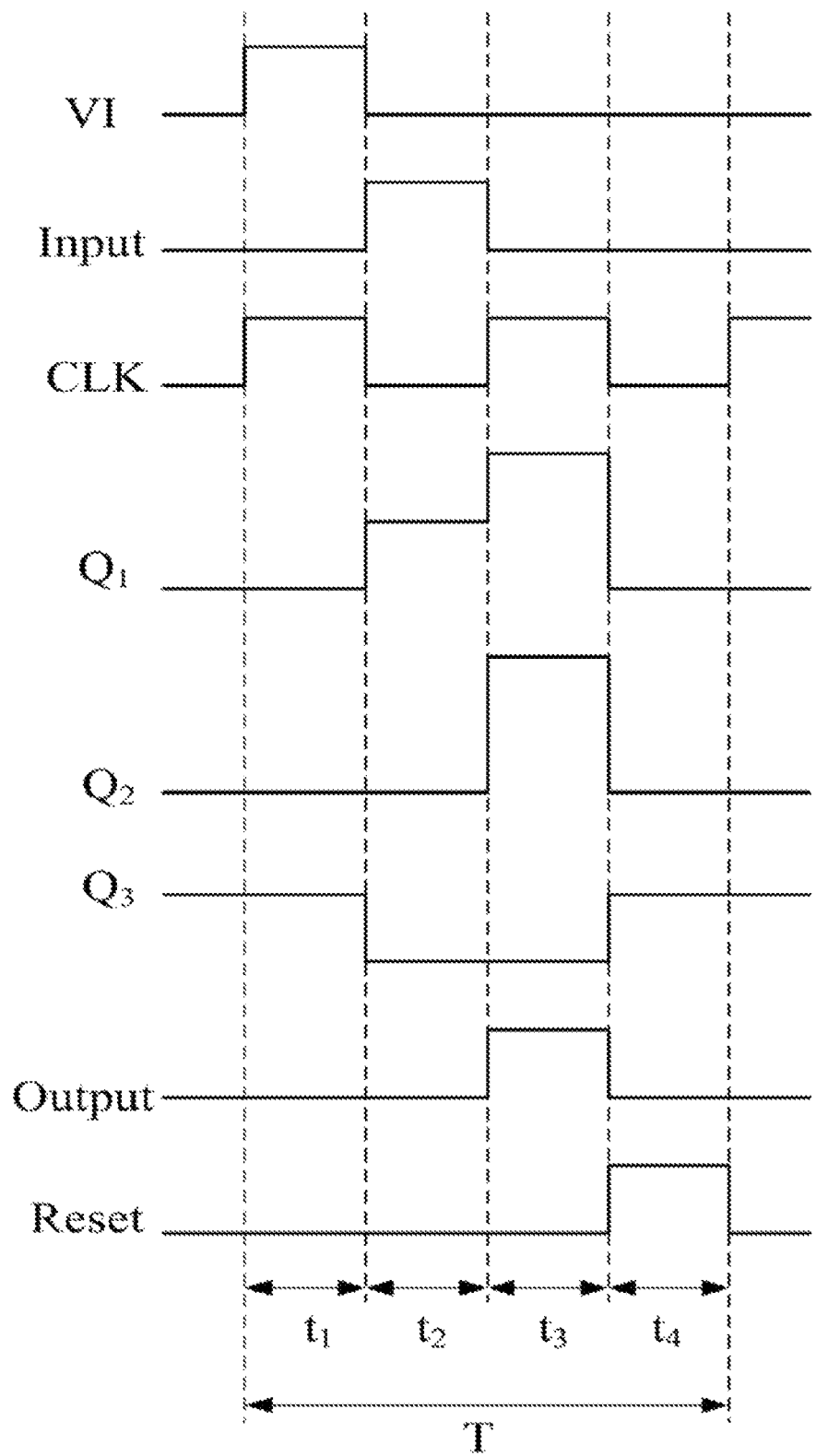
FIG. 7 is a timing control diagram of the gate drive circuit shown in FIG. 6.
Figure 8:
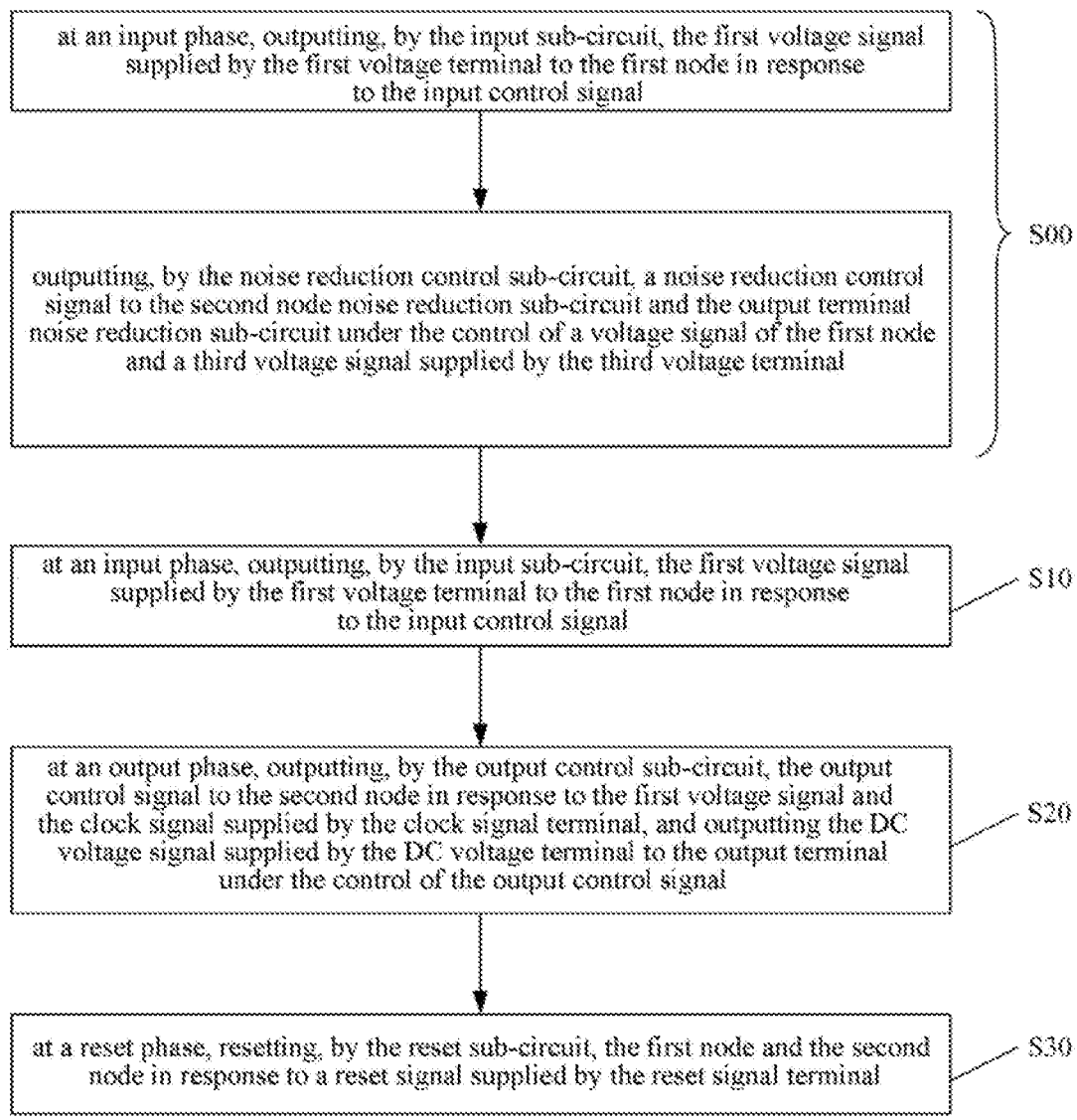
FIG. 8 is a flow chart showing a driving method for the gate drive circuit shown in FIG. 6.

It should be noted that referring to FIG. 6, when the above shift register unit is used as a shift register unit of a first stage in a corresponding gate drive circuit, the display input terminal Input, to which the input sub-circuit 1 in the shift register unit is coupled, would be a display control terminal STV, and a display control signal inputted from the display control terminal STV is used as an input control signal of the input sub-circuit 1. When the above shift register unit serves as another stage shift register unit, except for the shift register unit of the first stage in the corresponding gate drive circuit, the display input terminal Input to which the input sub-circuit 1 in the shift register unit is coupled is the output terminal(s) Output(s) of the shift register unit(s) of the previous stage(s). The DC voltage signal outputted by the corresponding output terminal Output is used as the input control signal of the input sub-circuit 1.

Referring to FIG. 5, the output control sub-circuit 2 of the above shift register unit includes a second transistor M2 and a third transistor M3. The second transistor M2 has a control electrode coupled to the first node $Q_1$, a first electrode coupled to the clock signal terminal CLK, and a second electrode coupled to a control electrode of the third transistor M3. The third transistor M3 also has a first electrode coupled to the first node $Q_1$ and a second electrode coupled to the second node $Q_2$. When the voltage signal, i.e. the first voltage signal, of the first node $Q_1$ controls the second transistor M2 to be turned on, the clock signal provided by the clock signal terminal CLK is output to the control electrode of the third transistor M3 through the second transistor M2. When the clock signal controls the third transistor M3 to be turned on, the first voltage signal is output to the second node $Q_2$ through the third transistor M3 as an output control signal.

The above output control sub-circuit 2 has a simple structure with the second transistor M2 and the third transistor M3, and it uses the voltage signal, i.e. the first voltage signal, of the first node $Q_1$ as the output control signal of the output sub-circuit 3 under the control of the clock signal provided by the clock signal terminal CLK, such that the output sub-circuit 3 may output the DC voltage signal provided by the DC voltage terminal VDD to the output terminal under the control of the output control signal, without the need for the direct connection between the output sub-circuit 3 and the clock signal terminal CLK to output the clock signal for driving. Based on this, the second transistor M2 coupled to the clock signal terminal CLK and the third transistor M3 coupled to the second transistor M2 do not have any effect on the output of the output sub-circuit 3. The second and third transistors M2 and M3 may have the same size as those of other transistors, so the second and third transistors M2 and M3 are smaller in size than a driving transistor directly coupled to the clock signal terminal CLK and the output terminal Output in the related art. Moreover, a parasitic capacitance formed among the respective control gates of the second and third transistors M2 and M3 and their respective remaining electrodes is relatively small, which may effectively reduce the dynamic power consumption of the shift register unit during its operation.

Referring to FIG. 5, the output sub-circuit 3 of the shift register unit includes a fourth transistor M4. The fourth transistor M4 has a control electrode coupled to the second node $Q_2$ to receive an output control signal, a first electrode coupled to the DC voltage terminal VDD, and a second electrode coupled to the output terminal Output. When the fourth transistor M4 is controlled to be turned on by the output control signal, it outputs the DC voltage signal supplied from the DC voltage terminal VDD to the output terminal Output.

Referring to FIG. 5, the noise reduction sub-circuit of the shift register unit includes a first noise reduction sub-circuit 4 and a second noise reduction sub-circuit 5. The second noise reduction sub-circuit 5 includes a noise reduction control sub-circuit 51, a second node noise reduction sub-circuit 52, and an output terminal noise reduction sub-circuit 53.

The first noise reduction sub-circuit 4 includes a fifth transistor M5. The fifth transistor M5 has a control electrode coupled to the second voltage terminal VI, a first electrode coupled to a common voltage terminal VSS to receive a common voltage signal, and a second electrode coupled to the output control sub-circuit 2, specifically to the control electrode of the third transistor M3 in the output control sub-circuit 2. When a second voltage signal supplied by the second voltage terminal VI controls the fifth transistor M5 to be turned on, the fifth transistor M5 outputs a common voltage signal supplied by the common voltage terminal VSS to the third transistor M3 of the output control sub-circuit 2, to control the third transistor M3 to be turned off and perform noise reduction on the output control sub-circuit 2.

The noise reduction control sub-circuit 51 includes a sixth transistor M6, a seventh transistor M7, an eighth transistor M8, a ninth transistor M9, and a third node $Q_3$. The sixth transistor M6 has a control electrode and a first electrode coupled to the third voltage terminal GCH, respectively, and a second electrode coupled to a control electrode of the seventh transistor M7. The seventh transistor M7 also has a first electrode coupled to the third voltage terminal GCH and a second electrode coupled to the third node $Q_3$. A control electrode of the eighth transistor M8 and a control electrode of the ninth transistor M9 are coupled to the first node $Q_1$. The eighth transistor M8 also has a first electrode coupled to the common voltage terminal VSS to receive a common voltage signal and a second electrode coupled to the third node $Q_3$. The ninth transistor M9 also has a first electrode coupled to the common voltage terminal VSS to receive the common voltage signal and a second electrode coupled to the control electrode of the seventh transistor M7.

The noise reduction control sub-circuit 51 is configured to output a noise reduction control signal under the control of the voltage signal of the first node $Q_1$ and the third voltage signal supplied by the third voltage terminal GCH. The noise reduction control signal includes a turn-on control signal for turning on the second node noise reduction sub-circuit 52 and the output terminal noise reduction sub-circuit 53 and a turn-off control signal for turning off the second node noise reduction sub-circuit 52 and the output terminal noise reduction sub-circuit 53.

Exemplarily, the sixth transistor M6, the seventh transistor M7, the eighth transistor M8, and the ninth transistor M9 are all controlled to be turned on by a high-level signal. The common voltage signal supplied by the common voltage terminal VSS is a constant low-level signal, and the third voltage signal supplied by the third voltage terminal GCH is a constant high-level signal. When the voltage signal of the first node $Q_1$ is a low-level signal, the eighth transistor M8 and the ninth transistor M9 are turned off, but the sixth transistor M6 and the seventh transistor M7 are turned on under the control of the third voltage signal. The sixth transistor M6 and the seventh transistor M7 output the third voltage signal supplied by the third voltage terminal GCH to the third node $Q_3$ as a turn-on control signal and control the second node noise reduction sub-circuit 52 and the output terminal noise reduction sub-circuit 53 to be turned on with the turn-on control signal. When the voltage signal of the first node $Q_1$ is a high-level signal, the eighth transistor M8 and the ninth transistor M9 are turned on, and the ninth transistor M9 outputs the common voltage signal supplied by the common voltage terminal VSS to the control electrode of the seventh transistor M7 so that the seventh transistor M7 is turned off. The eighth transistor M8 outputs the common voltage signal supplied by the common voltage terminal VSS to the third node $Q_3$ as a turn-off control signal, and controls the second node noise reduction sub-circuit 52 and the output terminal noise reduction sub-circuit 53 to be turned off using the turn-off control signal.

The second node noise reduction sub-circuit 52 includes a tenth transistor M10. The tenth transistor M10 has a control electrode coupled to the third node $Q_3$ to receive a noise reduction control signal, a first electrode coupled to the common voltage terminal VSS to receive a common voltage signal, and a second electrode coupled to the second node $Q_2$. When the noise reduction control signal is a turn-on control signal, the tenth transistor M10 is turned on under the control of the turn-on control signal and outputs the common voltage signal supplied by the common voltage terminal VSS to the second node $Q_2$, to perform noise reduction on the second node $Q_2$.

The output terminal noise reduction sub-circuit 53 includes an eleventh transistor M11. The eleventh transistor M11 has a control electrode coupled to the third node $Q_3$ to receive a noise reduction control signal, a first electrode coupled to the common voltage terminal VSS to receive a common voltage signal, and a second electrode coupled to an output terminal Output. When the noise reduction control signal is a turn-on control signal, the eleventh transistor M11 is turned on under the control of the turn-on control signal and outputs the common voltage signal supplied by the common voltage terminal VSS to the output terminal Output and perform noise reduction on the output terminal Output.

Referring to FIG. 5, the reset sub-circuit 7 of the shift register unit includes a twelfth transistor M12 and a thirteenth transistor M13. Control electrodes of the twelfth and thirteenth transistors M12 and M13 are coupled to a reset signal terminal Reset to receive a reset signal. The twelfth transistor M12 has a first electrode coupled to the common voltage terminal VSS to receive a common voltage signal, and a second electrode coupled to the first node $Q_1$. The thirteenth transistor M13 further includes a first electrode coupled to the common voltage terminal VSS to receive a common voltage signal, and a second electrode coupled to the second node $Q_2$. When the reset signal supplied by the reset signal terminal Reset controls the twelfth transistor M12 and the thirteenth transistor M13 to be turned on, the twelfth transistor M12 outputs the common voltage signal supplied by the common voltage terminal VSS to the first node $Q_1$ to reset the first node $Q_1$, that is, reset the output of the input sub-circuit 1. The thirteenth transistor M13 outputs the common voltage signal supplied by the common voltage terminal VSS to the second node $Q_2$ to reset the second node $Q_2$, that is, reset the input to the output sub-circuit 3.

Based on the shift register unit provided by the above embodiment, an embodiment of the present disclosure further provides a gate drive circuit. Referring to FIG. 6, the gate drive circuit is composed of a plurality of shift register units. The beneficial effects of the gate drive circuit provided by the embodiment of the present disclosure are the same as those of the shift register unit provided by the above embodiments, which will not be elaborated again herein.

Based on the gate drive circuit provided by the above embodiment, an embodiment of the present disclosure further provides a driving method for the gate drive circuit. Referring to FIGS. 5-8, the driving method includes the following steps.

In step S10, at an input phase $t_2$, a first voltage signal supplied by the first voltage terminal VGH is output, by the input sub-circuit 1, to the first node $Q_1$ in response to an input control signal.

In step S20, at an output phase $t_3$, an output control signal is output, by the output control sub-circuit 2, to the second node $Q_2$ in response to the first voltage signal and a clock signal supplied by the clock signal terminal CLK, and a DC voltage signal supplied by the DC voltage terminal VDD is output to the output terminal Output under the control of the output control signal.

It is to be understood that when each of the shift register units of the gate drive circuit includes the first noise reduction sub-circuit, the driving method for the gate drive circuit further includes the following steps before the input phase $t_2$.

In step S00, at a noise reduction phase $t_1$, noise reduction is performed, by the first noise reduction sub-circuit 4, on the output control sub-circuit 2 in response to a second voltage signal supplied by the second voltage terminal VI.

When each of the shift register units of the gate drive circuit includes the second noise reduction sub-circuit 5, the step S00 further includes: outputting, by the noise reduction control sub-circuit 51, a noise reduction control signal to the second node noise reduction sub-circuit 52 and the output terminal noise reduction sub-circuit 53 under the control of a voltage signal of the first node $Q_1$, and a third voltage signal supplied by the third voltage terminal GCH; and under the control of the noise reduction control signal, performing, by the second node noise reduction sub-circuit 52, noise reduction on the second node $Q_2$ and performing, by the output terminal noise reduction sub-circuit 53, noise reduction on the output terminal Output. The noise reduction control signal includes a turn-on control signal for turning on the second node noise reduction sub-circuit 52 and the output terminal noise reduction sub-circuit 53 and a turn-off control signal for turning off the second node noise reduction sub-circuit 52 and the output terminal noise reduction sub-circuit 53.

Certainly, when each of the shift register units of the gate drive circuit includes a reset sub-circuit 7, the driving method for the gate drive circuit further includes the following steps after the output phase $t_3$.

In step S30, at a reset phase $t_4$, the first node $Q_1$ and the second node $Q_2$ are reset by the reset sub-circuit 7 in response to a reset signal supplied by the reset signal terminal Reset.

It can be seen that one duty cycle T of each shift register unit in the gate drive circuit may sequentially include a noise reduction phase $t_1$, an input phase $t_2$, an output phase $t_3$, and a reset phase $t_4$.

In order to more clearly explain the driving method for the gate drive circuit provided by the above embodiment, an embodiment of the present disclosure takes an example of a gate drive circuit formed by cascading the shift register units shown in FIG. 5, and its driving method will be described below in detail.

In the gate drive circuit provided by this embodiment, each shift register unit adopts the structure shown in FIG. 5. The first transistor M1 to the thirteenth transistor M13 are all controlled to be turned on by a high-level signal, a common voltage signal supplied by the common voltage terminal VSS is a constant low-level signal, a first voltage signal supplied by the first voltage terminal VGH is a constant high-level signal, a third voltage signal supplied by the third voltage terminal GCH is a constant high-level signal, and a DC voltage signal supplied by the DC voltage terminal VDD is a constant high-level signal.

At the noise reduction phase $t_1$, a second voltage signal supplied by the second voltage terminal VI is a high-level signal, and the fifth transistor M5 of the first noise reduction sub-circuit 4 is turned on and outputs a low-level signal supplied by the common voltage terminal VSS to the third transistor M3 of the output control sub-circuit 2 and performs noise reduction on the output control sub-circuit 2 to prevent the output control sub-circuit 2 from having false output due to residual charges. The third voltage signal supplied by the third voltage terminal GCH is a high-level signal, and the sixth transistor M6 and the seventh transistor M7 of the noise reduction control sub-circuit 51 of the second noise reduction sub-circuit 5 are turned on and output the high-level signal supplied by the third voltage terminal GCH to the third node $Q_3$ as a turn-on control signal to turn on the tenth transistor M10 of the second node noise reduction sub-circuit 52 and the eleven transistor M11 of the output terminal noise reduction sub-circuit 53 and perform noise reduction on the second node $Q_2$ and the output terminal Output, thereby preventing the output sub-circuit 3 from having any false output due to residual charges.

At the input phase $t_2$, an input control signal of the shift register unit of the first stage is supplied by the display control terminal STV and the display control terminal STV outputs a high-level signal and controls the first transistor M1 of the input sub-circuit 1 to be turned on. For other shift register units except for the shift register unit of the first stage, the input control signal thereof will be a DC voltage signal outputted by the shift register unit of the previous stage or the shift register units of the previous several stages, and the DC voltage signal is a high-level signal, which controls the first transistor M1 of the input sub-circuit 1 to be turned on. The first transistor M1 is turned on to output a high-level signal supplied by the first voltage terminal VGH to the first node $Q_1$, and the storage capacitor of the storage sub-circuit 6 is charged, and the voltage signal at the first node $Q_1$ is pulled up; when the voltage signal at the first node $Q_1$ is at a high-level signal, the eighth transistor M8 and the ninth transistor M9 of the noise reduction control sub-circuit 51 are turned on, to pull down the voltage signal of the third node $Q_3$ and control the second node noise reduction sub-circuit 52 and the output terminal noise reduction sub-circuit 53 to be turned off; at this time, a clock signal outputted by the clock signal terminal CLK is at a low-level signal, and the third transistor M3 of the output control sub-circuit 2 is turned off, and the voltage signal of the second node $Q_2$ is at a low-level signal, and the output sub-circuit 3 has no signal output.

At the output phase $t_3$, the input control signal is at a low-level signal, and the first transistor M1 of the input sub-circuit 1 is turned off; the voltage signal of the first node $Q_1$ is maintained at a high level by the storage sub-circuit 6 and the second transistor M2 of the output control sub-circuit 2 is turned on; the clock signal outputted by the clock signal terminal CLK is at a high-level signal and the third transistor M3 of the output control sub-circuit 2 is turned on and the voltage signal of the first node $Q_1$ is output to the second node $Q_2$ through the third transistor M3. Due to the bootstrap effect of the third transistor M3, the voltage signals of the first node $Q_1$ and the second node $Q_2$ will be further pulled up, that is, these signals will be formed by the superimposition of the first voltage signal and a parasitic voltage signal. The parasitic voltage signal is generated due to a parasitic capacitance among the control electrode and other electrodes of the third transistor M3. The parasitic capacitance of the third transistor M3 is related to the size of the third transistor M3, the smaller the size is, the smaller the parasitic capacitance is, and the lesser the dynamic power consumption corresponding thereto is, so the appropriate minimization of the size may effectively reduce the dynamic power consumption of the shift register unit corresponding thereto.

When the voltage signal of the second node $Q_2$ is at a high-level signal, the fourth transistor M4 of the output sub-circuit 3 is turned on and outputs the DC voltage signal supplied by the DC voltage terminal VDD to the output terminal Output; at this time, the voltage signal of the third node $Q_3$ is at a low-level signal, and the second node noise reduction sub-circuit 52 and the output terminal noise reduction sub-circuit 53 are turned off, which can ensure the stable output of the output sub-circuit 3.

At the reset phase $t_4$, the reset signal supplied by the reset signal terminal Reset is at a high-level signal, and the twelfth transistor M12 and the thirteenth transistor M13 of the reset sub-circuit 7 are turned on; the twelfth transistor M12 outputs a low-level signal supplied by the common voltage terminal VSS to the first node $Q_1$ to reset the first node $Q_1$, that is, an output side of the input sub-circuit 1, meanwhile, the thirteenth transistor M13 outputs a low-level signal supplied by the common voltage terminal VSS to the first second node $Q_2$ to reset the second node $Q_2$, that is, an input side of the output sub-circuit 3.

The voltage signal of the reset first node $Q_1$ is at a low-level signal, and the second transistor M2 and the third transistor M3 of the output control sub-circuit 2 are turned off, and there is no signal output from the output sub-circuit 3; meanwhile, the eighth transistor M8 and the ninth transistor M9 of the noise reduction control sub-circuit 51 in the second noise reduction sub-circuit 5 are turned off, but the sixth transistor M6 and the seventh transistor M7 of the noise reduction control sub-circuit 51 are turned on, and the noise reduction control sub-circuit 51 may output a high-level signal supplied by the third voltage terminal GCH to the third node $Q_3$ as a turn-on control signal and control the second node noise reduction sub-circuit 52 and the output terminal noise reduction sub-circuit 53 to be turned on and perform noise reduction on the second node $Q_2$ and the output terminal Output, thereby further ensuring that the output sub-circuit 3 has no signal output.

As can be seen from the above, at the noise reduction phase $t_1$ and the reset phase $t_4$, the voltage signal of the third node $Q_3$ is always at a high-level signal, that is, the second node noise reduction sub-circuit 52 and the output terminal noise reduction sub-circuit 53 in the second noise reduction sub-circuit 5 may be continuously turned on at the noise reduction phase $t_1$ and the reset phase $t_4$, to continuously reduce noise of the second node $Q_2$ and the output terminal Output, which further prevents the corresponding shift register unit from having any false output and improves the yield of the gate drive circuit.

The beneficial effects of the driving method for the gate drive circuit provided by the embodiment of the present disclosure are the same as those of the shift register unit and the gate drive circuit provided by the above embodiments, which will not be elaborated herein. The above-described are only specific embodiments of the present disclosure, and the protection scope of the present disclosure is not limited thereto. Any person skilled in the art can easily be conceived of changes or substitutions that fall into the protection scope of the present disclosure within the technical scope of this disclosure. Therefore, the protection scope of the present disclosure should be limited by the protection scope of the claims.

What is claimed is:

1. A shift register unit, comprising:
an input sub-circuit, an output control sub-circuit, an output sub-circuit, and a noise reduction sub-circuit comprising a first noise reduction sub-circuit and a second noise reduction sub-circuit, wherein:
the input sub-circuit is coupled to a first node and a first voltage terminal, and configured to output a first voltage signal supplied by the first voltage terminal to the first node in response to an input control signal;
the output control sub-circuit is coupled to the first node, a second node, and a clock signal terminal, and configured to output an output control signal to the second node in response to the first voltage signal and a clock signal supplied by the clock signal terminal;
the output sub-circuit is coupled to the second node, a DC voltage terminal, and an output terminal, and configured to output a DC voltage signal supplied by the DC voltage terminal to the output terminal under control of the output control signal;
the first noise reduction sub-circuit is coupled to a second voltage terminal and the output control sub-circuit, and is configured to perform noise reduction on the output control sub-circuit in response to a second voltage signal supplied by the second voltage terminal;
the second noise reduction sub-circuit comprises a noise reduction control sub-circuit, a second node noise reduction sub-circuit, and an output terminal noise reduction sub-circuit;
the noise reduction control sub-circuit is coupled to a third voltage terminal, the first node, the second node noise reduction sub-circuit, and the output terminal noise reduction sub-circuit, and is configured to output a noise reduction control signal to the second node noise reduction sub-circuit and the output terminal noise reduction sub-circuit under control of a voltage signal at the first node and a third voltage signal supplied by the third voltage terminal;
the second node noise reduction sub-circuit is coupled to the second node and is configured to perform noise reduction on the second node under control of the noise reduction control signal; and
the output terminal noise reduction sub-circuit is coupled to the output terminal and is configured to perform noise reduction on the output terminal under control of the noise reduction control signal.

2. The shift register unit of claim 1, wherein:
the input sub-circuit comprises a first transistor; and
the first transistor has a control electrode coupled to a display input terminal to receive the input control signal, a first electrode coupled to the first voltage terminal, and a second electrode coupled to the first node.

3. The shift register unit of claim 1, wherein:
the output control sub-circuit comprises a second transistor and a third transistor;
the second transistor has a control electrode coupled to the first node, a first electrode coupled to the clock signal terminal, and a second electrode coupled to a control electrode of the third transistor; and
the third transistor further has a first electrode coupled to the first node and a second electrode coupled to the second node.

4. The shift register unit of claim 1, wherein:
the output sub-circuit comprises a fourth transistor; and
the fourth transistor has a control electrode coupled to the second node to receive the output control signal, a first electrode coupled to the DC voltage terminal, and a second electrode coupled to the output terminal.

5. The shift register unit of claim 1, wherein:
the first noise reduction sub-circuit comprises a fifth transistor; and
the fifth transistor has a control electrode coupled to the second voltage terminal, a first electrode coupled to a common voltage terminal to receive a common voltage signal, and a second electrode coupled to the output control sub-circuit.

6. The shift register unit of claim 1, wherein:
the noise reduction control sub-circuit comprises a sixth transistor, a seventh transistor, an eighth transistor, a ninth transistor and a third node;
the sixth transistor has a control electrode and a first electrode coupled to the third voltage terminal, respectively, and a second electrode coupled to a control electrode of the seventh transistor;
the seventh transistor further has a first electrode coupled to the third voltage terminal and a second electrode coupled to the third node;
a control electrode of the eighth transistor and a control electrode of the ninth transistor are coupled to the first node respectively and the eighth transistor further has a first electrode coupled to a common voltage terminal to receive a common voltage signal and a second electrode coupled to the third node;
the ninth transistor further has a first electrode coupled to the common voltage terminal to receive the common voltage signal and a second electrode coupled to the control electrode of the seventh transistor;
the second node noise reduction sub-circuit comprises a tenth transistor; the tenth transistor having a control electrode coupled to the third node to receive the noise reduction control signal, a first electrode coupled to the common voltage terminal to receive the common voltage signal, and a second electrode coupled to the second node; and
the output terminal noise reduction sub-circuit comprises an eleventh transistor, the eleventh transistor having a control electrode coupled to the third node to receive the noise reduction control signal, a first electrode coupled to the common voltage terminal to receive the common voltage signal, and a second electrode coupled to the output terminal.

7. The shift register unit of claim 1, wherein the shift register unit further comprises a storage sub-circuit, the storage sub-circuit being coupled to the first node and the output terminal, and being configured to store the first voltage signal received by the first node.

8. The shift register unit of claim 1, wherein:
the shift register unit further comprises a reset sub-circuit; and
the reset sub-circuit is coupled to a reset signal terminal, the first node, and the second node, and is configured to reset the first node and the second node in response to a reset signal provided by the reset signal terminal.

9. The shift register unit of claim 8, wherein:
the reset sub-circuit comprises a twelfth transistor and a thirteenth transistor;

control electrodes of the twelfth transistor and the thirteenth transistor are coupled to the reset signal terminal, respectively;

the twelfth transistor further has a first electrode coupled to a common voltage terminal to receive a common voltage signal, and a second electrode coupled to the first node; and the thirteenth transistor further has a first electrode coupled to the common voltage terminal to receive the common voltage signal, and a second electrode coupled to the second node.

10. A gate drive circuit, comprising:
a plurality of cascaded shift register units, each of the cascaded shift register units comprising an input sub-circuit, an output control sub-circuit, an output sub-circuit, and a noise reduction sub-circuit comprising a first noise reduction sub-circuit and a second noise reduction sub-circuit, wherein:
  the input sub-circuit is coupled to a first node and a first voltage terminal, and is configured to output a first voltage signal supplied by the first voltage terminal to the first node in response to an input control signal;
  the output control sub-circuit is coupled to the first node, a second node, and a clock signal terminal, and is configured to output an output control signal to the second node in response to the first voltage signal and a clock signal supplied by the clock signal terminal;
  the output sub-circuit is coupled to the second node, a DC voltage terminal, and an output terminal, and is configured to output a DC voltage signal supplied by the DC voltage terminal to the output terminal under control of the output control signal;
  the first noise reduction sub-circuit is coupled to a second voltage terminal and the output control sub-circuit, and is configured to perform noise reduction on the output control sub-circuit in response to a second voltage signal supplied by the second voltage terminal;
  the second noise reduction sub-circuit comprises a noise reduction control sub-circuit, a second node noise reduction sub-circuit, and an output terminal noise reduction sub-circuit;
  the noise reduction control sub-circuit is coupled to a third voltage terminal, the first node, the second node noise reduction sub-circuit, and the output terminal noise reduction sub-circuit, and is configured to output a noise reduction control signal to the second node noise reduction sub-circuit and the output terminal noise reduction sub-circuit under control of a voltage signal at the first node and a third voltage signal supplied by the third voltage terminal;
  the second node noise reduction sub-circuit is coupled to the second node and is configured to perform noise reduction on the second node under control of the noise reduction control signal; and
  the output terminal noise reduction sub-circuit is coupled to the output terminal and is configured to perform noise reduction on the output terminal under control of the noise reduction control signal.

11. The gate drive circuit of claim 10, wherein:
the input sub-circuit comprises a first transistor; and
the first transistor has a control electrode coupled to a display input terminal to receive the input control signal, a first electrode coupled to the first voltage terminal, and a second electrode coupled to the first node.

12. The gate drive circuit of claim 10, wherein:
the output control sub-circuit comprises a second transistor and a third transistor;
the second transistor has a control electrode coupled to the first node, a first electrode coupled to the clock signal terminal, and a second electrode coupled to a control electrode of the third transistor; and
the third transistor further has a first electrode coupled to the first node and a second electrode coupled to the second node.

13. The gate drive circuit of claim 10, wherein:
the output sub-circuit comprises a fourth transistor; and
the fourth transistor has a control electrode coupled to the second node to receive the output control signal, a first electrode coupled to the DC voltage terminal, and a second electrode coupled to the output terminal.

14. A driving method for a gate drive circuit, comprising:
providing a plurality of cascaded shift register units, each of the cascaded shift register units comprising an input sub-circuit, an output control sub-circuit, an output sub-circuit, and a noise reduction sub-circuit comprising a first noise reduction sub-circuit and a second noise reduction sub-circuit, wherein:
  the input sub-circuit is coupled to a first node and a first voltage terminal, and is configured to output a first voltage signal supplied by the first voltage terminal to the first node in response to an input control signal;
  the output control sub-circuit is coupled to the first node, a second node, and a clock signal terminal, and is configured to output an output control signal to the second node in response to the first voltage signal and a clock signal supplied by the clock signal terminal;
  the output sub-circuit is coupled to the second node, a DC voltage terminal, and an output terminal, and is configured to output a DC voltage signal supplied by the DC voltage terminal to the output terminal under control of the output control signal;
  the first noise reduction sub-circuit is coupled to a second voltage terminal and the output control sub-circuit; and
  the second noise reduction sub-circuit comprises a noise reduction control sub-circuit, a second node noise reduction sub-circuit, and an output terminal noise reduction sub-circuit, the noise reduction control sub-circuit being coupled to a third voltage terminal, the first node, the second node noise reduction sub-circuit, and the output terminal noise reduction sub-circuit, the second node noise reduction sub-circuit being coupled to the second node, and the output terminal noise reduction sub-circuit being coupled to the output terminal;
before an input phase and at a noise reduction phase, performing, by the first noise reduction sub-circuit, noise reduction on the output control sub-circuit in response to a second voltage signal supplied by the second voltage terminal;
at the input phase, outputting, by the input sub-circuit, the first voltage signal supplied by the first voltage terminal to the first node in response to the input control signal;
at an output phase, outputting, by the output control sub-circuit, the output control signal to the second node in response to the first voltage signal and the clock signal supplied by the clock signal terminal; and outputting the DC voltage signal supplied by the DC voltage terminal to the output terminal under control of the output control signal, wherein the noise reduction phase further comprises:

outputting, by the noise reduction control sub-circuit, a noise reduction control signal to the second node noise reduction sub-circuit and the output terminal noise reduction sub-circuit under control of a voltage signal of the first node and a third voltage signal supplied by the third voltage terminal; and performing, by the second node noise reduction sub-circuit, noise reduction on the second node and performing, by the output terminal noise reduction sub-circuit, noise reduction on the output terminal, under control of the noise reduction control signal.

15. The driving method of claim 14, wherein:

each of the cascaded shift register units of the gate drive circuit comprises a reset sub-circuit which is coupled to a reset signal terminal, the first node, and the second node; and the driving method further comprises, after the output phase and at a reset phase, resetting, by the reset sub-circuit, the first node and the second node in response to a reset signal supplied by the reset signal terminal.

\* \* \* \* \*